(12) United States Patent
Lin et al.

(10) Patent No.: US 7,677,885 B2
(45) Date of Patent: Mar. 16, 2010

(54) MATERIAL SUPPLY DEVICE FOR DIFFUSION FURNACES

(75) Inventors: Cheng-Yi Lin, Hsin-Tien (TW); Ying-Chieh Chan, Hsin-Tien (TW); Hsun-Min Lee, Hsin-Tien (TW)

(73) Assignee: Lite-On Semiconductor Corporation, Taipei Hsien (TW)

( * ) Notice: Subject to any disclaimer, the term of this patent is extended or adjusted under 35 U.S.C. 154(b) by 667 days.

(21) Appl. No.: 11/654,644

(22) Filed: Jan. 18, 2007

(65) Prior Publication Data

US 2008/0173599 A1 Jul. 24, 2008

(51) Int. Cl.
*F27D 3/00* (2006.01)

(52) U.S. Cl. .................. 432/239; 432/123; 432/253; 432/258; 414/152; 414/935; 414/940

(58) Field of Classification Search .................. 432/123, 432/208, 239, 253, 258; 414/1, 152, 935, 414/936, 937, 939, 940, 941; 211/41.17, 211/41.18

See application file for complete search history.

(56) References Cited

U.S. PATENT DOCUMENTS 4,459,104 A * 7/1984 Wollmann ................... 432/123
4,543,059 A * 9/1985 Whang et al. ................. 432/11

* cited by examiner

*Primary Examiner*—Sam Chuan C Yao
*Assistant Examiner*—Seth G Greenia
(74) *Attorney, Agent, or Firm*—Rosenberg, Klein & Lee

(57) ABSTRACT

A material supply device for diffusion furnaces includes a main body, a fixing pedestal mechanism, a transmission mechanism and a cover mechanism for a furnace door. The main body includes a base portion and a main rod. The base portion is mounted on the main rod and the main rod extends through the base portion. The fixing pedestal mechanism is mounted on the main rod and is pivotedly mounted on a fixing pedestal. The transmission mechanism is mounted on the base portion and has a transmission rod slidably mounted on the base portion. The cover mechanism for a furnace door is fixed on an end of the transmission rod which is far away from the main body and is turnablely mounted on a cover of the furnace door. Based on the above assemblies, the present invention runs smoothly and improves production quality.

8 Claims, 7 Drawing Sheets

MATERIAL SUPPLY DEVICE FOR DIFFUSION FURNACES

BACKGROUND OF THE INVENTION

1. Field of the Invention

The present invention relates to a material supply device, and more especially to a material supply device for diffusion furnaces used in semiconductor processes.

2. Description of the Prior Art

A prior material supply device for diffusion furnaces is mounted in the front of a furnace chamber of a diffusion furnace and engages with a track. A driving rod is arranged on the track and connects to the material supply device to drive the material supply device to move with the movement of the track. The diffusion furnace has a carrying arm for carrying the material which is supplied for the diffusion furnaces.

The material supply device includes a main body, a supporting and connecting mechanism, a fixing pedestal, a transmission mechanism, and a cover of the furnace door. The supporting and connecting mechanism is mounted at a side of the main body and connects with the driving rod of the track. The fixing pedestal is fixed under the main body for the carrying arm to pass through. The carrying arm carries the material which is supplied for the diffusion furnaces. The transmission mechanism is mounted on the main body and has a slidable transmission rod. The cover of the furnace door is fixed on an end of the transmission rod. Based on the above assemblies, the material supply device can send the material into a furnace pipe of the furnace chamber for heating.

The prior material supply device has the following shortcomings:

1. The fixing pedestal lacks a movable mechanism with a buffering function so the material supply device is easily damaged.

2. Without a locating structure, the transmission mechanism shakes a lot from left and right which rotates the cover of the furnace door when moving back and forth, thereby the cover of the furnace door deviates and cannot closely engage with an opening of the furnace pipe.

3. The supporting and connecting mechanism can only be adjusted to move up and down, left and right, corresponding to the driving rod, and the angle cannot be adjusted to engage with the driving rod. As such, the supporting and connecting mechanism produces mechanical stress when in use that damages the material supply device.

4. The cover of the furnace door is unmovable, so the difference between a level degree of the furnace pipe and that of the cover of the furnace door results in the cover of the furnace door not engaging with the furnace pipe well, which influences the temperature in processes.

Hence, the inventors of the present invention believe that the shortcomings described above are able to be improved and finally suggest the present invention which is of a reasonable design and is an effective improvement based on deep research and thought.

SUMMARY OF THE INVENTION

An object of the present invention is to provide a material supply device for diffusion furnaces which has a movable fixing pedestal for buffering and a turnable cover mechanism for a furnace door that ensures the cover of the furnace door firmly engages with a furnace pipe. Thereby the material supply device will run smoothly and steadily improve production quality.

Another object of the present invention is to provide a material supply device for diffusion furnaces which has a locating structure mounted on a transmission mechanism to prevent the cover of the furnace door from rotating and deviating and has a supporting and connecting mechanism that allows an angle to be adjusted to avoid damage being caused.

To achieve the above-mentioned objects, a material supply device for diffusion furnaces in accordance with the present invention is disclosed. The material supply device for diffusion furnaces includes a main body which includes a base portion and a main rod. The base portion is mounted on the main rod and the main rod extends through the base portion. A fixing pedestal mechanism is mounted on the main rod and pivotedly mounted upon a fixing pedestal. A transmission mechanism is also mounted on the base portion and there is a transmission rod slidably mounted on the base portion. Finally, there is a cover mechanism for a furnace door which is fixed on an end of the transmission rod which is far away from the main body and turnablely mounted on the cover of the furnace door.

The present invention improves efficacy, can be easily adjusted to reduce maintenance time, and ensures steadily operating to improve production quality and reduce failure rate.

To further understand the features and technical contents of the present invention, please refer to the following detailed description and drawings related the present invention. However, the drawings are only to be used as references and explanations, not to limit the present invention.

DETAILED DESCRIPTION OF THE INVENTION

Figure 1:
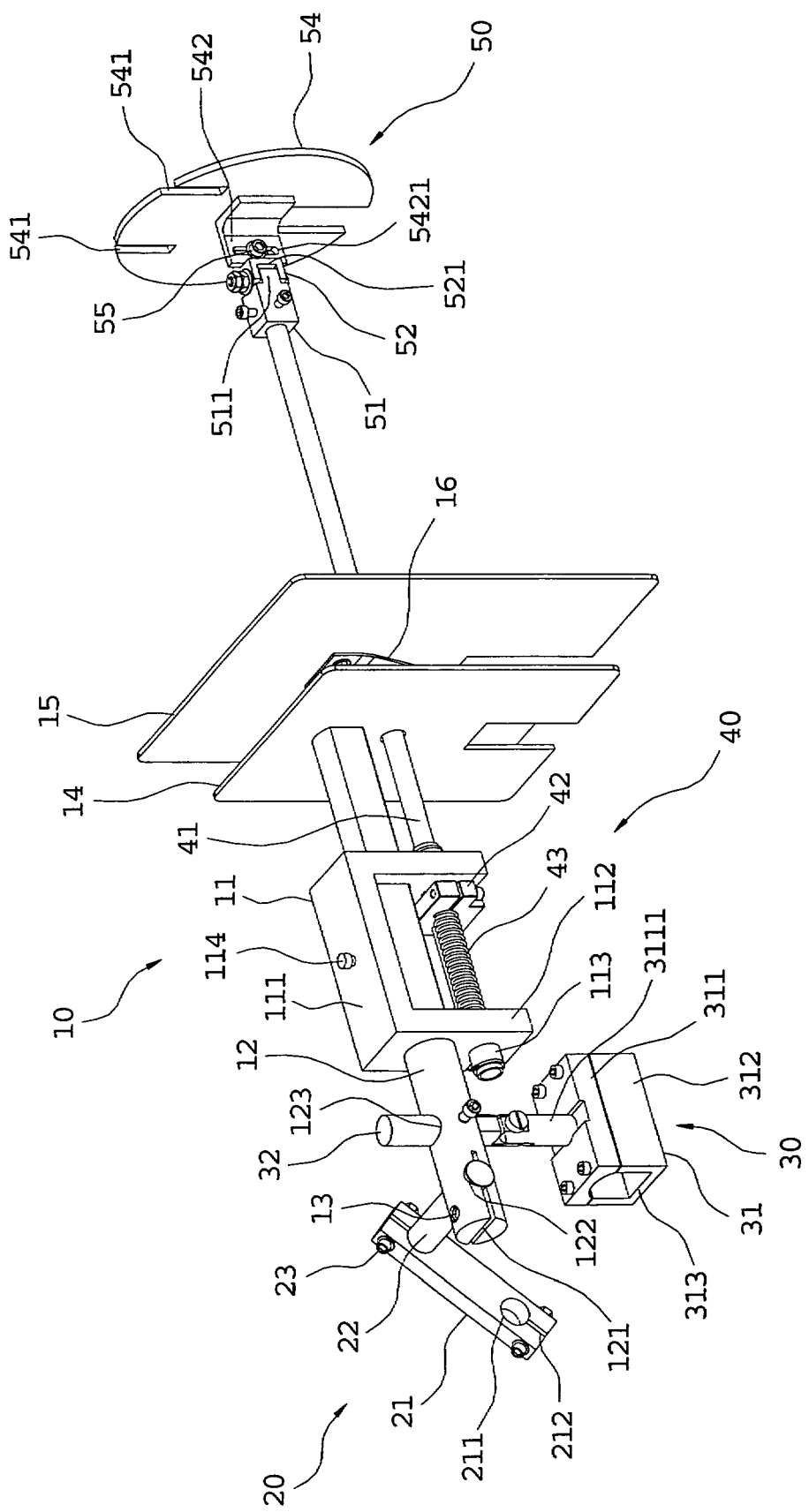
FIG. 1 is an assembled perspective view of a material supply device for diffusion furnaces in accordance with the present invention.

Please refer to FIG. 1 which shows a material supply device for diffusion furnaces in accordance with a preferred embodiment of the present invention. The material supply device for diffusion furnaces includes a main body 10, a supporting and connecting mechanism 20, a fixing pedestal mechanism 30, a transmission mechanism 40 and a cover mechanism for a furnace door 50.

The main body 10 includes a base portion 11 and a main rod 12. The base portion 11 has a top board 111 and two side boards 112 parallelly extending downwards from two sides of the top board 111. A screw 114 is mounted on a center of the top board 111 and extends through the top board 111 between the two side boards 112. The two side boards 112 are mounted relative to each other and each has a bearing 113 fixed near a bottom end thereof. The two bearings 113 are mounted relative to each other. The side board 112 near the fixing pedestal mechanism 30 has a guiding slot 1121 (please refer to FIG. 4) concavely on a right side surface and the guiding slot 1121 extends through the side board 112 from a front surface to a back surface.

The main rod 12 passes through the two side boards 112 of the base portion 11 which is fixed on a middle part of the main rod 12 via the screw 114 on the top board 111. The main rod 12 has a horizontal opening slot 121 in a front surface. The opening slot 121 extends into the inside of the main rod 12 for a proper distance and connects with a first through-hole 122. The first through-hole 122 horizontally extends through the main rod 12 and connects with the supporting and connecting mechanism 20.

The main rod 12 further has a fixing hole 123 therethrough from top to bottom. The fixing hole 123 is located between the first through-hole 122 and the base portion 11.

A first steel plate 14 is mounted on a back end of the main rod 12 and a second steal plate 15 whose area is larger than that of the first steel plate 14 is mounted at the rear of the first steel plate 14. The first steel plate 14 and the second steel plate 15 have a distance therebetween and connect to each other via an elastic piece 16.

Figure 2:
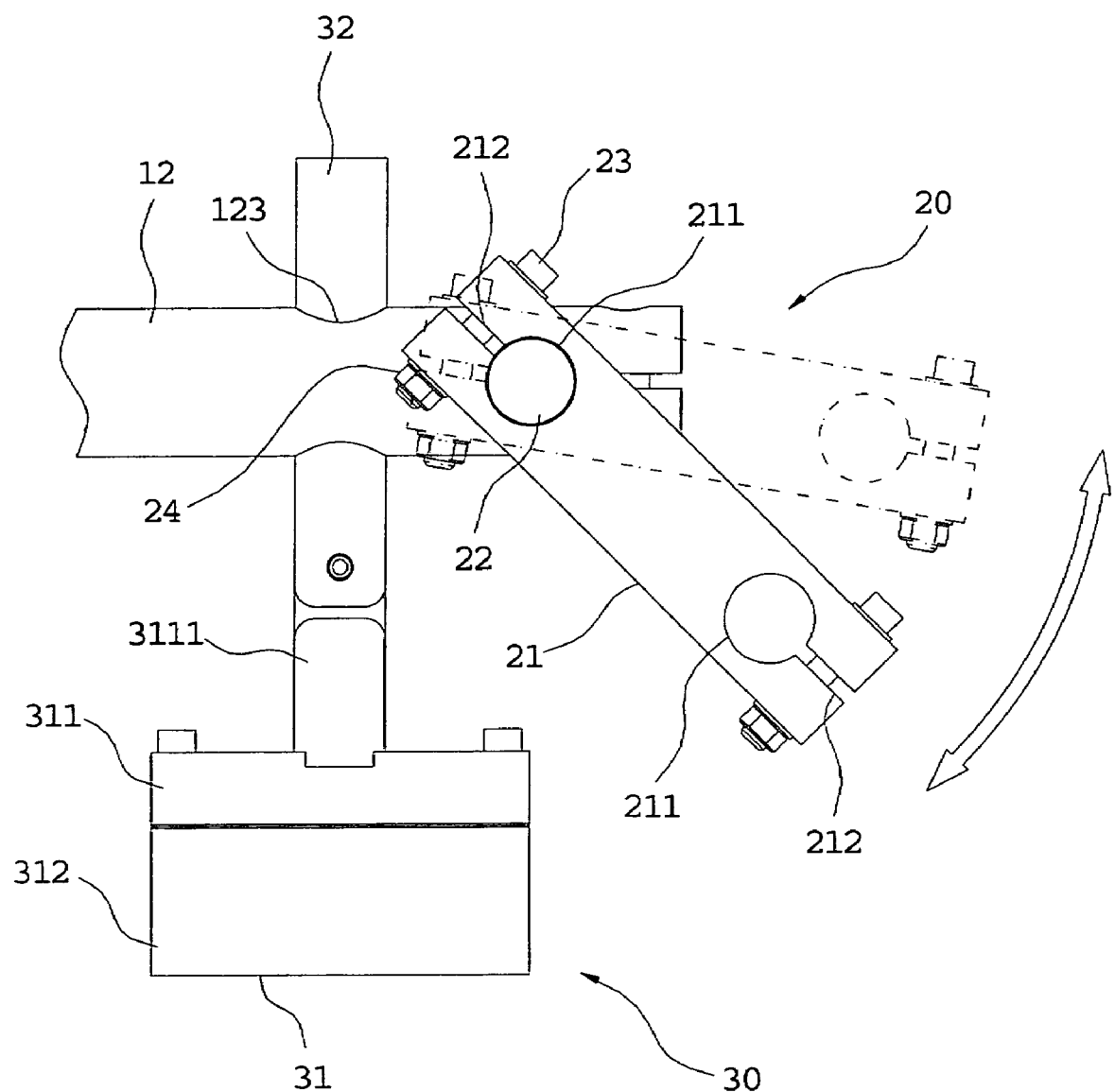
FIG. 2 is a sketched view of a main rod engaged with a supporting and connecting mechanism of the material supply device for diffusion furnaces in accordance with the present invention.

Please refer to FIG. 2. The supporting and connecting mechanism 20 includes a swing arm 21 and an inserting rod 22. The swing arm 21 is shaped like a rectangle and has two second through-holes 211 near two ends thereof respectively. Each second through-hole 211 connects with a clamping slot 212 which penetrates through two surfaces of the swing arm 21.

One end of the inserting rod 22 is inserted in the first through-hole 122 of the main rod 12 (please refer to FIG. 1). The opening slot 121 is locked via the engagement of a screw 13 and a screw hole (not shown) inside the main rod 12 to fix the end of the inserting rod 22 in the main rod 12.

The other end of the inserting rod 22 is inserted in one of the two second through-holes 211 of the swing arm 21 so that the swing arm 21 can adjust the angle via the second through-hole 211. When a needed angle is determined, the clamping slot 212 is locked via the engagement of screw bolts 23 and screw caps 24 which are mounted on two sides of the swing arm 21 respectively, so that the swing arm 21 can be fixed on the end of the inserting rod 22. Accordingly, the supporting and connecting mechanism 20 is mounted on the left side near the front end of the main body 10.

Figure 3:
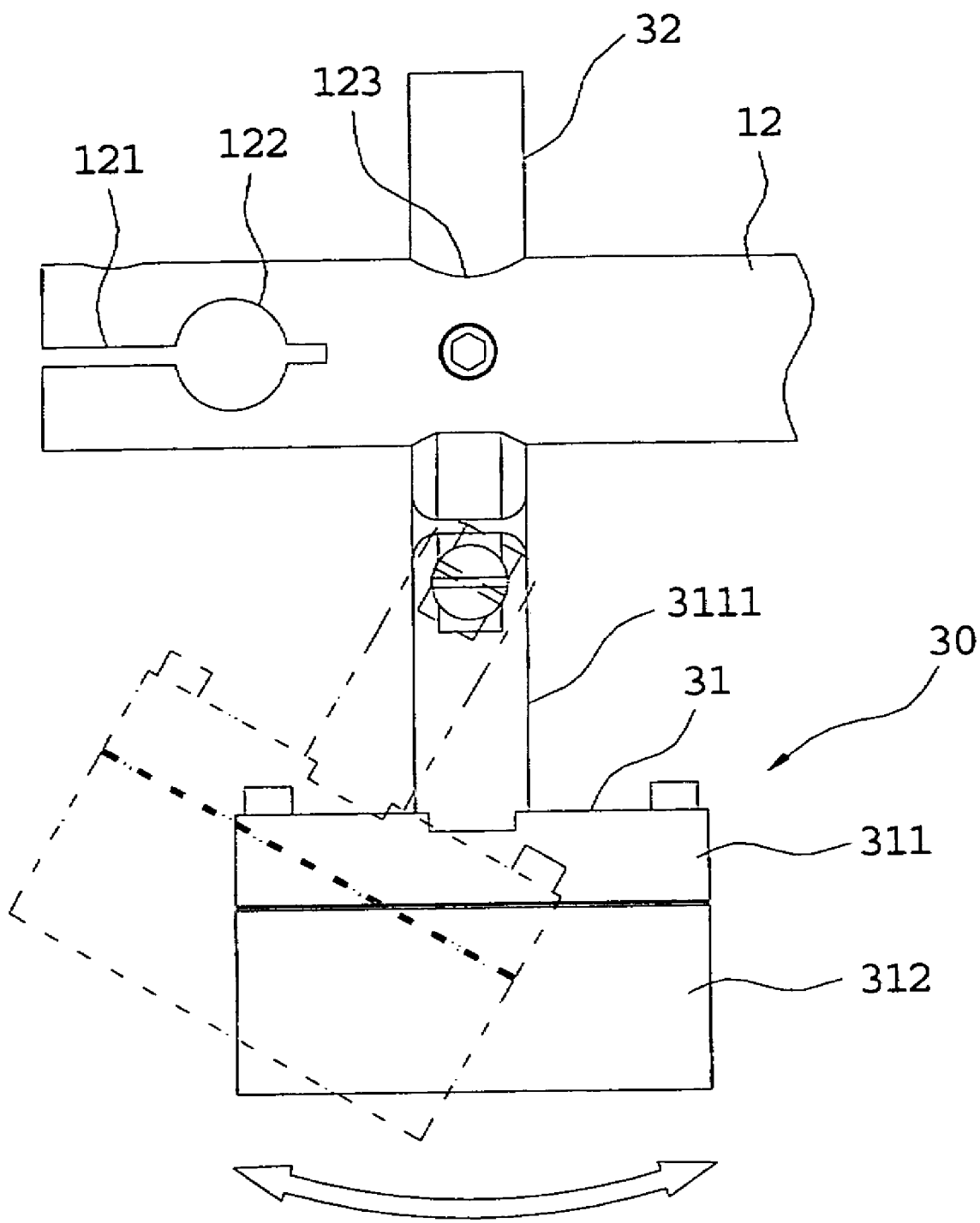
FIG. 3 is a sketched view of the main rod engaged with a fixing pedestal mechanism of the material supply device for diffusion furnaces in accordance with the present invention.

Please refer to FIG. 3. The fixing pedestal mechanism 30 includes a fixing pedestal 31 and a fixing rod 32. The fixing pedestal 31 has a cover 311 and a base 312. The cover 311 has a connecting rod 3111 protruding upwards from a top thereof. The cover 311 engages with the base 312 and is fixed on an upper flange of the base 312. A jointing slot 313 is formed between the cover 311 and the base 312 (please refer to FIG. 1) and extends through the fixing pedestal 31 from a front surface to a back surface.

The fixing rod 32 is inserted in the fixing hole 123 of the main rod 12 and is fixed on the main rod 12 via a screw thread engagement. Thereby the fixing pedestal mechanism 30 can be mounted on the main rod 12 via the fixing rod 32. A bottom end of the fixing rod 32 pivotedly connects with a top end of the connecting rod 3111 so that the fixing pedestal 31 can rotate relative to the fixing rod 32 and be pivotedly mounted on the fixing pedestal mechanism 30.

Figure 4:
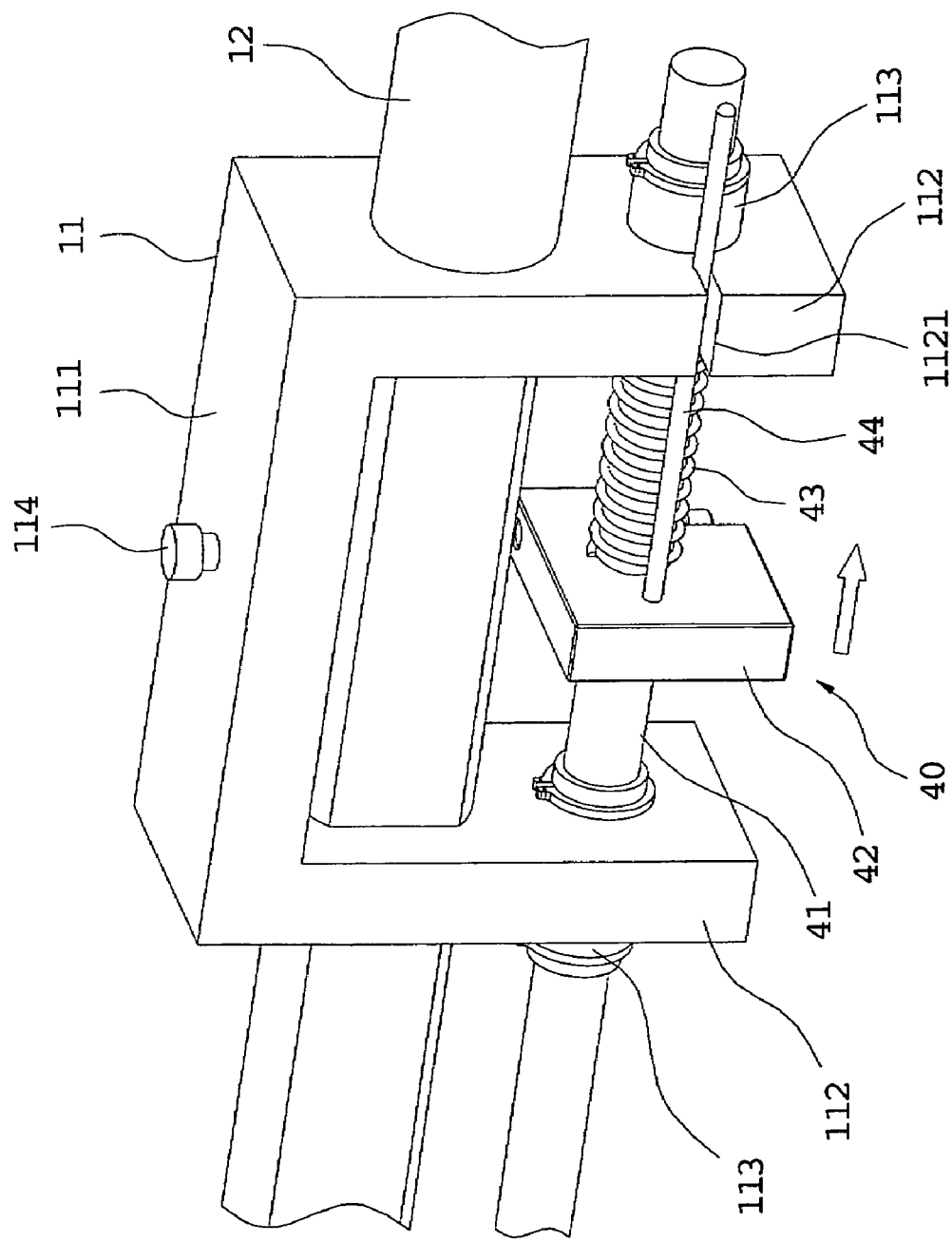
FIG. 4 is a sketched view of a positioning and guiding rod of the material supply device moving backwards for diffusion furnaces in accordance with the present invention.

Please refer to FIG. 4. The transmission mechanism 40 includes a transmission rod 41, a block 42, a spring 43, and a positioning and guiding rod 44. The transmission mechanism 41 is mounted on the base portion 11 under the main rod 12. The transmission mechanism 41 penetrares through the bearings 113 of the two side boards 112, the first steel plate 14, and the second steel plate 15 in turn (please refer to FIG. 1) and out of a back end of the second steel plate 15 to connect to the cover mechanism for a furnace door 50. The transmission rod 41 is slidably mounted on the base portion 11 via the two bearings 113.

The block 42 is shaped like a rectangle and fixed on the transmission rod 41 between the two side boards 112 of the base portion 11. The block 42 moves in synchronization with the transmission rod 41.

The spring 43 is mounted between the block 42 and the side board 112 which is close to the fixing pedestal 31. The spring 43 sheathes the transmission rod 41 and collides with the block 42 and the side board 112 to provide a restoring force to the transmission rod 41.

The positioning and guiding rod 44 is shaped like a thin pole and corresponds to a guiding slot 1121 of the base portion 11. One end of the positioning and guiding rod 44 is fixed in the block 42 and the other end is slidably mounted on the base portion through the guiding slot 1121. The positioning and guiding rod 44 moves in synchronization with the transmission rod 41.

Figure 5:
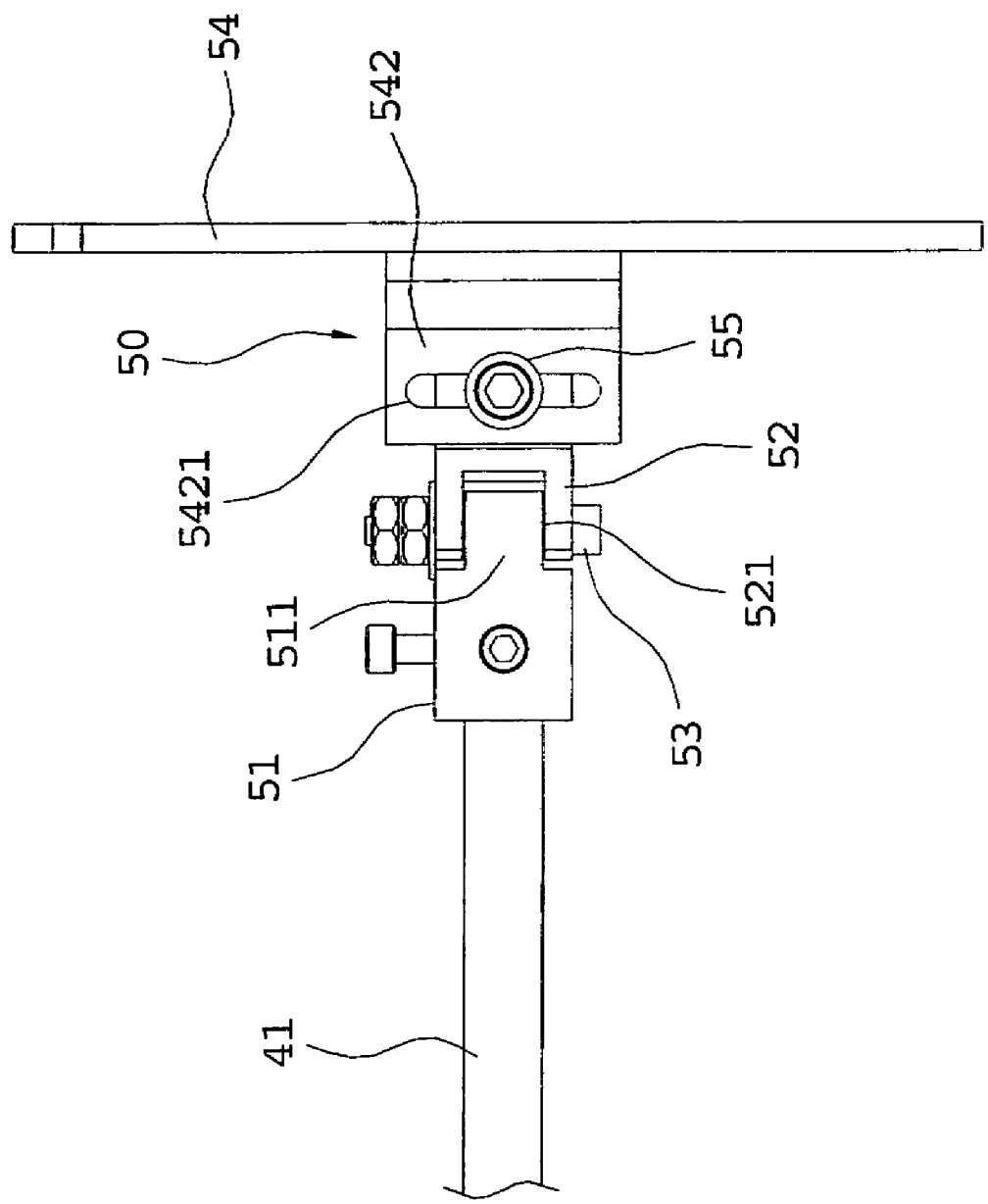
FIG. 5 is a side elevational view of a cover mechanism for a furnace door of a material supply device for diffusion furnaces in accordance with the present invention.
Figure 6:
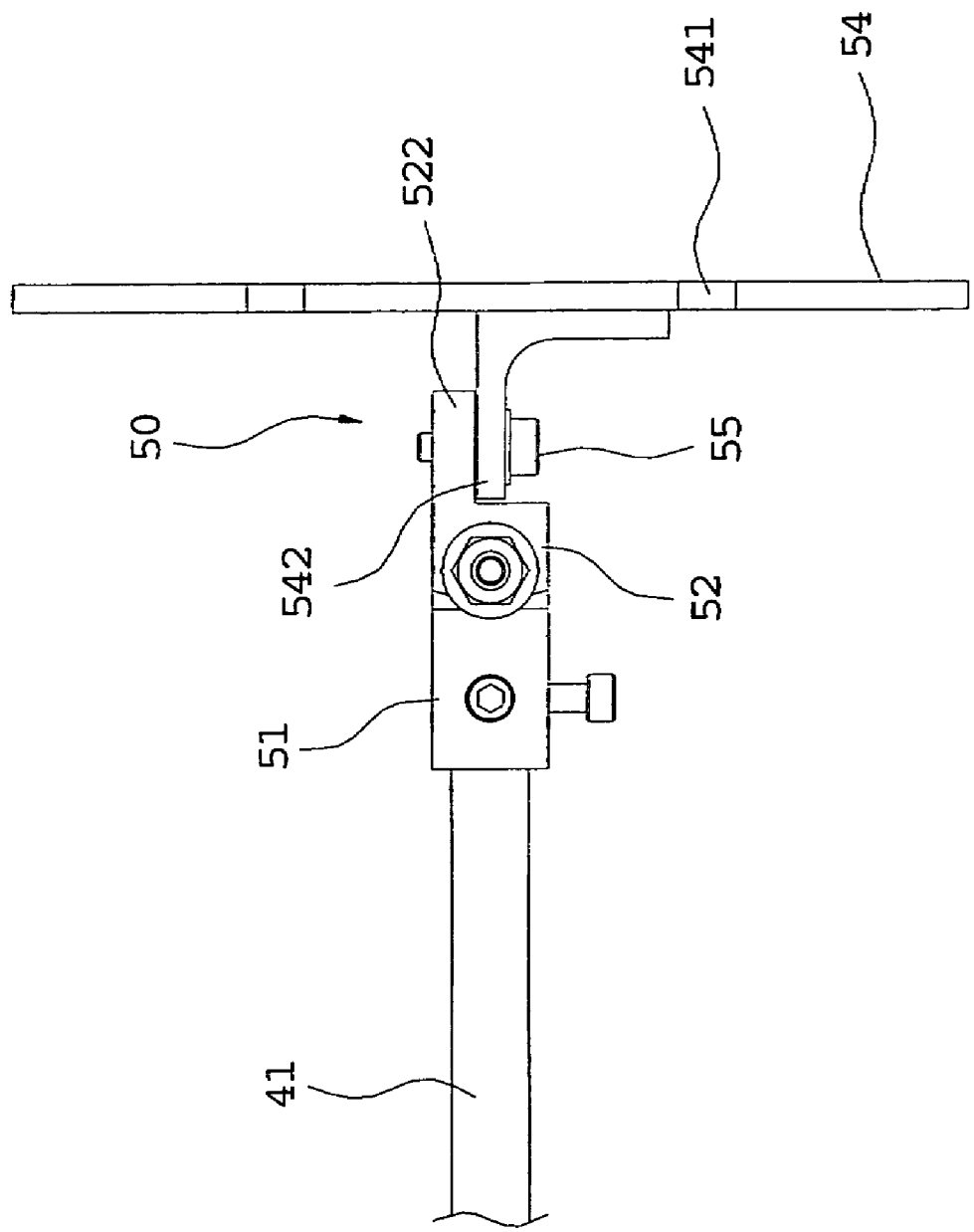
FIG. 6 is a top plan view of the cover mechanism for a furnace door of a material supply device for diffusion furnaces in accordance with the present invention.
Figure 7:
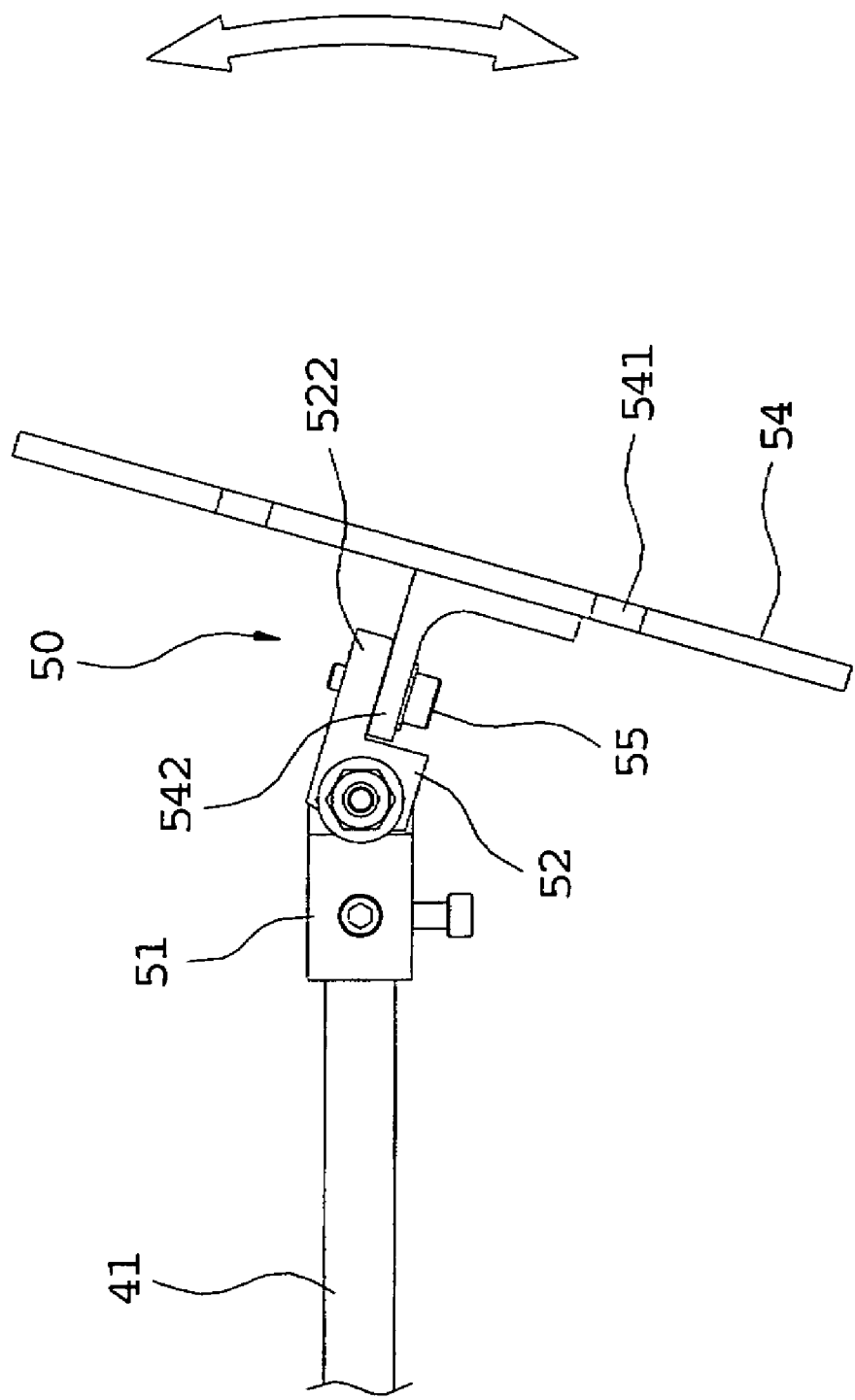
FIG. 7 is a sketched view showing actions of the cover mechanism for a furnace door of the material supply device for diffusion furnaces in accordance with the present invention.

Please refer to FIGS. 5-7. The cover mechanism for a furnace door 50 includes a switching portion 51, a pivoted piece 52, a pivot piece 53 and a cover of a furnace door 54. The switching portion 51 is fixed on the transmission rod 41 and has a protruding portion 511 protruding backwards to fix the cover mechanism for a furnace door 50 on an end of the transmission rod 41 which is far away from the main body 10 (please refer to FIG. 1).

The pivoted piece 52 has a concave portion 521 concaved at a front end, corresponding to the protruding portion 511. The protruding portion 511 extends into the concave portion 521. The pivot piece 53 extends through the concave portion 521 and the protruding portion 511 to turnably connect the switching portion 51 with the pivoted piece 52. A jointing portion 522 extends backwards from a back end of the pivoted piece 52 (please refer to FIG. 6).

The cover of the furnace door 54 is shaped somewhat like a circle. Two grooves 541 are concavely formed on an upper flange of the cover of the furnace door 54 at intervals for hanging a quartz blocking board upon (not shown). A fixing portion 542 protrudes from a front surface of the cover of the furnace door 54 and there is a long slot 5421 extending through a left side surface and a right side surface of the fixing portion 542. A screw 55 extends through the long slot 5421 and is locked in the joining portion 522 of the pivoted piece 52 to contact the fixing portion 542 with the pivoted piece 52. The cover of the furnace door 54 is mounted on the cover mechanism for a furnace door 50 via the pivoted piece 52 and the switching portion 51 and can turn left and right thereby to form a movable structure. Furthermore, through the engagement of the long slot 5421 and the screw 55, the up and down position of the cover of the furnace door 54 can be adjusted relative to the transmission rod 41.

The material supply device of the present invention engages with a carrying arm (not shown), a furnace chamber (not shown) and a track (not shown) of a diffusion furnace. The carrying arm (not shown) is inserted in the jointing slot 313 of the fixing pedestal 31 and clamped between the cover 311 and the base 312. The furnace chamber has a furnace pipe (not shown) inside. The track is fixed on a driving rod (not shown). The driving rod is inserted in a second through-hole 211 of the swing arm 21 so that the material supply device can engage with the driving rod with an adjusted angle via the supporting and connecting mechanism 20.

When the track is running, the driving rod can drive the whole material supply device to move in order that the carrying arm mounted on the fixing pedestal 31 moves towards the diffusion furnace and sends the material into the furnace pipe for heating. When the cover of the furnace door 54 covers an opening of the furnace pipe, the second steel plate 15 will cover an opening of the furnace chamber and the first steel plate 14 will lap over the second steel plate 15 and collide with the second steel plate 15 to seal the opening of the furnace chamber. At this time, the transmission rod 41 is forced to move forwards and the block 42 presses the spring 43 to make the positioning and guiding rod 44 extend forwards and out of the base portion 11 (please refer to FIG. 4). The positioning and guiding rod 44 prevents the transmission rod 41 from shaking left and right and the cover of the furnace door 54 from rotating.

Accordingly, the material supply device for diffusion furnaces of the present invention can run smoothly and steadily to improve production quality. The features and efficacy of the present invention can be summed up as follows:

1. The fixing pedestal has a movable structure, by which the fixing pedestal can connect with the carry arm of the diffusion furnace and provide a buffering function to the material supply device when the material supply device moves back and forth, thereby preventing the material supply device from being damaged.

2. The transmission mechanism has a positioning and guiding rod. The positioning and guiding rod guides the transmission mechanism and ensures that the transmission rod can only move back and forth steadily and cannot shake left and right, thereby avoiding driving the cover of the furnace door to rotate.

3. The supporting and connecting mechanism assists the material supply device to adjust the angle relative to the driving rod of the track to relieve mechanical stress and avoid damaging the material supply device.

4. The cover mechanism for a furnace door has a movable cover of the furnace door which can turn left and right and automatically corrects to compensate for the difference between a level degree of the furnace pipe and that of the cover of the furnace door.

What is disclosed above is only the preferred embodiment of the present invention and it is therefore not intended that the present invention be limited to the particular embodiments disclosed. It will be understood by those skilled in the art that various equivalent changes may be made depending on the specification and the drawings of present invention without departing from the scope of the present invention.

What is claimed is:

1. A material supply device for diffusion furnaces, comprising:
    a main body, including a base portion and a main rod, the base portion is mounted on the main rod and the main rod extends through the base portion;
    a fixing pedestal mechanism, mounted on the main rod and pivotedly mounting a fixing pedestal on;
    a transmission mechanism, mounted on the base portion and having a transmission rod slidably mounted on the base portion; and
    a cover mechanism for a furnace door, fixed on an end of the transmission rod which is far away from the main body and turnablely mounting a cover of the furnace door on.

2. The material supply device for diffusion furnaces as claimed in claim 1, wherein the base portion has two side boards mounted relative to each other, each of which has a bearing, the two bearings are fixed relative to each other and the transmission rod is slidably mounted on the base portion via the two bearings.

3. The material supply device for diffusion furnaces as claimed in claim 1, wherein the main rod has a fixing hole, the fixing pedestal mechanism has a fixing rod, a connecting rod protrudes from the fixing pedestal and pivotedly connects with the fixing rod, and the fixing rod is inserted in the fixing hole of the main rod.

4. The material supply device for diffusion furnaces as claimed in claim 1, wherein the transmission mechanism includes a block and a spring, the block is fixed on the transmission rod and moves in synchronization with the transmission rod, and the spring is mounted between the block and the base portion and sheaths the transmission rod.

5. The material supply device for diffusion furnaces as claimed in claim 4, wherein the transmission mechanism includes a positioning and guiding rod which moves in synchronization with the transmission rod, the base portion has a guiding slot corresponding to the positioning and guiding rod, and one end of the positioning and guiding rod is fixed in, the block and the other end is slidably mounted on the base portion through the guiding slot.

6. The material supply device for diffusion furnaces as claimed in claim 1, further comprising a supporting and connecting mechanism mounted at a side of the main body and including a swing arm and an inserting rod of which one end is fixed on the main rod and the other end is mounted on the swing arm.

7. The material supply device for diffusion furnaces as claimed in claim 1, wherein the cover mechanism for a furnace door includes a switching portion and a pivoted piece, the switching portion is fixed on the transmission rod and the pivoted piece pivotedly connects with the switching portion, and a fixing portion protrudes from the cover of the furnace door and contacts the pivoted piece.

8. The material supply device for diffusion furnaces as claimed in claim 7, wherein the fixing portion has a long slot, a screw extends through the long slot and is locked in the pivoted piece, and the cover of the furnace door is mounted on the pivoted piece via an engagement of the long slot and the screw.

* * * * *